United States Patent
Chung

[19]

[11] Patent Number: 6,040,247
[45] Date of Patent: Mar. 21, 2000

[54] METHOD FOR ETCHING CONTACT

[75] Inventor: Seong Woo Chung, Chungcheongbuk-do, Rep. of Korea

[73] Assignee: LG Semicon Co., Ltd., Chungcheongbuk-do, Rep. of Korea

[21] Appl. No.: 08/779,744

[22] Filed: Jan. 7, 1997

Related U.S. Application Data

[63] Continuation of application No. 08/371,070, Jan. 10, 1995, abandoned.

[51] Int. Cl.⁷ .................................................. H01L 21/302
[52] U.S. Cl. ......................... 438/713; 438/714; 438/723; 438/725
[58] Field of Search .................................... 438/725, 723, 438/713, 714; 216/50, 80, 720

[56] References Cited

U.S. PATENT DOCUMENTS

| | | | |
|---|---|---|---|
| 4,324,611 | 4/1982 | Vogel et al. | 156/643 |
| 4,522,681 | 6/1985 | Gorowitz et al. | 156/643 |
| 4,671,849 | 6/1987 | Chen et al. | 156/643 |
| 4,678,540 | 7/1987 | Uchimura et al. | 156/643 |
| 4,698,128 | 10/1987 | Berglund et al. | 156/643 |
| 4,764,245 | 8/1988 | Grewal | 156/643 |
| 4,814,041 | 3/1989 | Auda | 156/643 |
| 4,902,377 | 2/1990 | Berglund et al. | 156/643 |
| 5,021,121 | 6/1991 | Groechel et al. | 156/643 |
| 5,094,712 | 3/1992 | Becker et al. | 156/643 |
| 5,176,790 | 1/1993 | Ardeo et al. | 156/643 |
| 5,286,344 | 2/1994 | Blalock et al. | 156/643 |
| 5,340,769 | 8/1994 | Miyamoto | 437/67 |
| 5,346,586 | 9/1994 | Keller | 156/643 |

FOREIGN PATENT DOCUMENTS

| | | |
|---|---|---|
| 63-114215 | 5/1988 | Japan . |
| 2-082525 | 3/1990 | Japan . |

OTHER PUBLICATIONS

"Effects of Additive Gas On $SiO_2$ Etching," Miyakawa et al.; Material Res. Soc. Symp. Proc.; abstract, 1993.

"Tapered Aluminum Interconnect Etch", Allen; J. Voc. Sci. Tech.; A (1994), 12(4, Pt. 1); pp. 1265–1268.

*Primary Examiner*—Benjamin Utech
*Assistant Examiner*—George Goudreau
*Attorney, Agent, or Firm*—Finnegan, Henderson, Farabow, Garrett & Dunner, L.L.P.

[57] ABSTRACT

A method for etching a contact for forming a contact hole having a sidewall profile with a single process by controlling a flow rate of carrier gas at an etcher having a mixture of gases, the mixture including $CF_4$, a polymer forming gas and a carrier gas, including steps for forming an insulation layer on a substrate, exposing a portion of the insulation layer by providing a photoresist pattern on the insulation layer, etching the insulation layer to form the contact hole, the contact hole having a sloped sidewall. The step of etching the insulation layer includes the steps of, introducing a plurality of gases into an etching chamber, the plurality of gases including a first gas including $CF_4$, a second gas including a polymer forming gas, and a third gas including a balance gas and controlling a flow rate into the etching chamber of the balance gas, and removing the photoresist pattern from the insulation layer.

2 Claims, 7 Drawing Sheets

50 SCCM Ar(MERIE)

0 SCCM Ar(MERIE)

400 SCCM Ar(RIE)

200 SCCM Ar(RIE)

METHOD FOR ETCHING CONTACT

This application is a continuation of application Ser. No. 08/371,070, filed Jan. 10, 1995, now abandoned.

BACKGROUND OF THE INVENTION

1. Field of the Invention

This invention relates to a process for etching a semiconductor device, and more particularly to a method for etching a contact for forming a contact hole having a sloped sidewall profile using a single process.

2. Discussion of the Related Art

As the integration of semiconductor elements advances, the size of each element becomes smaller and accordingly the size of a contact hole also becomes smaller. If a contact hole is formed with a dry etching method, the side walls are made vertical, creating an insufficient overlay margin at the time of carrying out a deposition process.

To solve these problems, an etching process for forming a contact hole having a sloped sidewall profile has been proposed.

FIGS. 1(a)–1(d) show conventional etching processes for forming a sloped contact hole utilizing multiple insulation films which have different etching rates from each other.

In FIG. 1(a), a photoresist layer 13 is coated and then patterned to form opening 14 on an insulation layer 12 on substrate 11. The insulation layer 12 includes a $SiO_2$ layer 12A and a PSG layer 12B, which have different etching rates.

After patterning, opening 14 exposes a portion of the surface of the insulation layer 12. As shown in FIGS. 1(b) and 1(c), the exposed insulation layer 12 is etched under $CHF_3/O_2$ gas chemistry with the photoresist pattern used as a mask.

The process for etching the insulation layer 12 is divided into two steps. First, an opening 15 is formed by plasma etching the PSG layer 12B of the insulation layer 12 until the lower $SiO_2$ layer 12A is exposed with an $O_2$ flow rate of about 15% of the total gas flow. Then, an opening 15' is formed by etching the $SiO_2$ layer 12A until the substrate is exposed with an $O_2$ flow rate of about 3% of the total gas flow.

The $SiO_2$ layer 12A has a lower etching rate than the PSG layer 12B under $CHF_3$. Since the PSG layer 12B is also etched at the time of etching the $SiO_2$ layer 12A in the second step, the slope at the opening 15' is increased. During this step, $O_2$ serves to reduce the polymer produced by the use of a polymer gas of $CHF_3$.

Referring to FIG. 1(d), a contact hole having a predetermined slope can be formed by carrying out an etching process with an $O_2$ flow rate of about 90%. In which case, the photoresist pattern 13 is etched faster than the insulation layer 14' and the PSG layer 12B is etched faster than the $SiO_2$ layer 12A, thereby forming the contact hole having a predetermined slope.

The processes for forming a contact hole as shown in FIGS. 1(a)–1(d) requires three steps and includes etching the insulation layers of PSG and $SiO_2$, which have different etching rates from each other.

In a first step, a small portion of a slope is formed by etching the PSG layer with 10–20% of the $O_2$ flow of the total gas flow using $CHF_3/O_2$ gas chemistry. In a second step, the $SiO_2$ layer is etched with 1–8% of the $O_2$ flow rate. In a third step the photoresist pattern together with the insulation layer is etched with 80–100% of the $O_2$ flow rate, causing the PSG layer to have a greater slope.

A contact hole having a predetermined slope can be formed by etching the PSG and $SiO_2$ insulation layers, which have different etching rates from each other, using several steps of controlled $O_2$ flow.

The foregoing contact hole forming process is complicated because it requires three steps, and since the photoresist pattern is also etched at the time of etching the insulation layer, reproducibility of the process is poor.

FIGS. 2(a)–2(c) show conventional etching processes for forming a sloped contact hole utilizing both an isotropic etching and an anisotropic etching.

Referring to FIG. 2(a), by forming an interlayer insulation layer 22 on a first conductive layer 21, and by coating and patterning a photoresist film on the interlayer insulation layer 22, a photoresist pattern is formed.

An opening 24 is formed by carrying out an isotropic etching of the interlayer insulation layer 22 with the photoresist pattern 23 used as a mask, and a via hole is then enlarged downward under the opening 24 by carrying out an anisotropic etching of the interlayer insulation layer 22.

Referring to FIG. 2(b), the side walls and the upper surface of the photoresist pattern 23 are subjected to an isotropic etching as shown by the dotted lines 25, with a mask erosion step. By carrying out such isotropic etching steps and mask erosion steps repeatedly, a sloped via hole 26, as shown in FIG. 2(c), can be formed.

After forming the sloped via hole 26, photoresist pattern 23 is removed, and sloped in hole 26 is coated with a second conductive layer 27, as shown in FIG. 2(d).

The foregoing method for forming a contact hole is complicated because it requires repeating isotropic etching steps and mask erosion steps. Further, since the slope is stepped, it is not possible to form a contact hole having a smooth slope.

FIGS. 3(a)–3(d) show another conventional process for forming a sloped contact hole utilizing processes for etching a photoresist film and a substrate repeatedly.

As shown in FIG. 3(a), an opening 33 is formed by coating and patterning a photoresist film 32 on a substrate 31.

As shown in FIG. 3(b), the substrate 31 is subjected to an etching with the photoresist film 32 used as a mask, and then the polymer produced during the foregoing process is removed.

FIG. 3(c) shows etching a part of the photoresist film 32 in the dotted lines. Then, as shown in FIG. 3(d), the substrate 31 is again subjected to an etching with the photoresist film 32 used as a mask.

By repeating the foregoing processes, a sloped contact hole 34 can be completed. However, since the contact hole is formed by repeating the three steps of etching a photoresist film, etching a substrate process and removing a polymer, the foregoing process is complicated and provides poor reproducibility. Further, since the slope is stepped, a smooth contact hole with the desired slope can not be obtained.

FIGS. 4(a) and 4(b) show a conventional process for forming a sloped contact hole by controlling the flow of $CHF_3/CF_4$.

Referring to FIG. 4(a), an insulation layer 42, such as an oxide film, is formed on a substrate (not shown).

The insulation layer 42 is formed thick enough to cover a metal conductive layer 41 already formed on the substrate.

A photoresist pattern 43 is then formed by coating and patterning a photoresist film on the insulation film 42.

FIG. 4(b) shows an exposed surface of the insulation layer 42 after etching through opening 44. Specifically, a contact hole 45 is formed by carrying out etching of the insulation layer 42 until the conductive layer 41 is exposed with the photoresist pattern 43 used as a mask under a $CHF_3/CF_4$ gas chemistry mixture.

This etching process is carried out over two steps. First, a large slope is formed by etching an insulation layer 42 under a gas flow with 25% of $CHF_3$ gas, and second a predetermined slope is formed by etching the insulation layer 42 again under a gas flow with 5–25% of $CHF_3$ gas.

The foregoing etching processes are used for forming a contact hole having a predetermined slope by controlling the flow rate of $CHF_3/CF_4$ gas. If the $CF_4$ gas flow rate should become greater than the $CHF_3$ flow rate, then it is not possible to form a contact hole having a predetermined slope due to formation of a polymer on the sidewalls of the contact hole during the first etching step.

Further, since the contact hole is formed through two processes requiring a controlled $CHF_3/CF_4$ gas ratio, the foregoing processes are complicated and provide poor reproducibility.

As has been explained, the conventional etching processes for forming a sloped contact hole are complicated, provide for poor reproducibility, and also make it difficult to form a predetermined smooth slope due to those processes which only yield a stepped slope.

SUMMARY OF THE INVENTION

The present invention has been made in view of the above circumstances and has as an object to provide a process for etching a contact, which uses a single process to simplify the process of forming a contact hole having a predetermined slope.

Another object of this invention is to provide a process for etching a contact, which can form a sloped sidewall profile by etching a micro contact hole under a controlled flow of carrier gas.

A further object of this invention is to provide a process for etching a contact, which is favorable for securing an overlay margin at the photoetching process and can improve the step coverage of a deposition film.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the method for etching a contact of this invention includes steps for, forming an insulation layer on a substrate, exposing a part of the insulation layer by forming a photoresist pattern on the insulation layer, etching the insulation layer to form a contact hole with a sloped sidewall, by controlling a flow rate of balance gas at an etcher having a mixture of gases, the mixture including $CF_4$, a polymer forming gas, and the balance gas, and a step for removing a remaining photoresist pattern.

As for the polymer forming gas, gases, such as $CHF_3$, $C_2F_6$, $CF_3$, $C_3F_8$, and $C_4F_8$ are used, and as for the balance gas, gases, such as Ar, He, Xe, and $N_2$ are used.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

DETAILED DESCRIPTION OF THE INVENTION

Embodiments of this invention are to be explained hereinafter in detail, referring to the attached drawings.

Figure 1A:
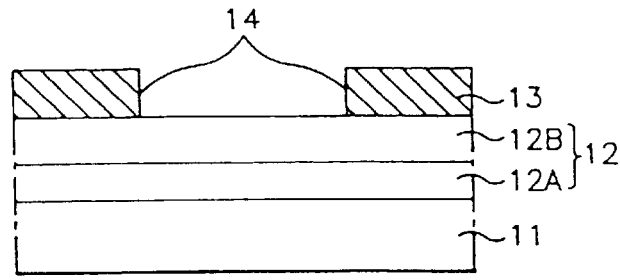
FIGS. 1(a)–1(d) are sectional views showing successive steps in a conventional process for etching a contact.
Figure 1B:
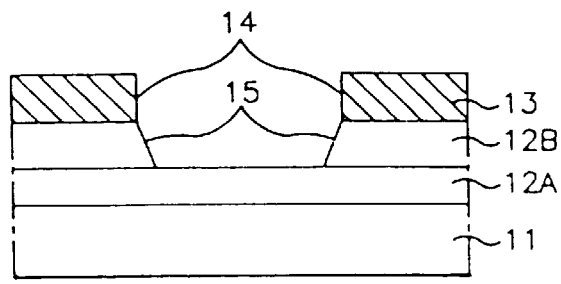
Figure 1C:
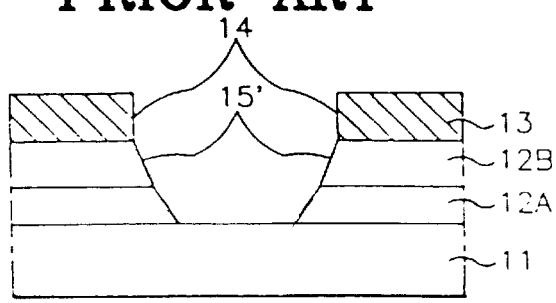
Figure 1D:
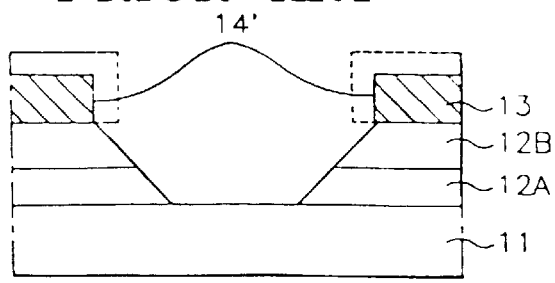
Figure 2A:
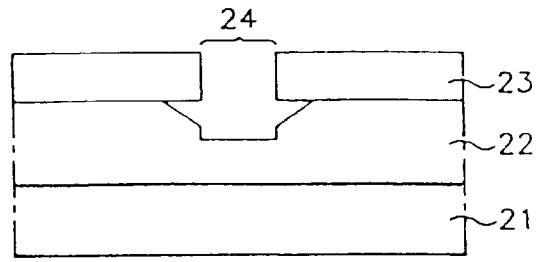
FIGS. 2(a)–2(d) are sectional views showing successive steps in a conventional process for etching a contact.
Figure 2B:
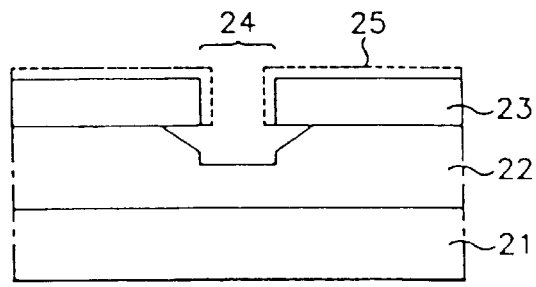
Figure 2C:
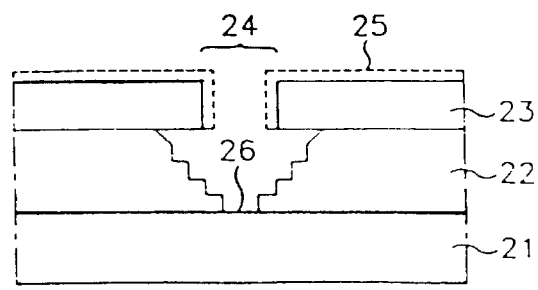
Figure 2D:
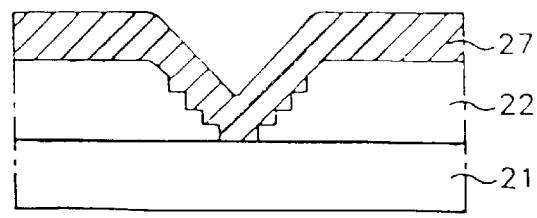
Figure 3A:
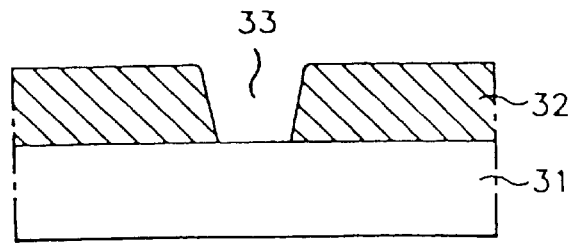
FIGS. 3(a)–3(d) are sectional views showing successive steps in a conventional process for etching a contact.
Figure 3B:
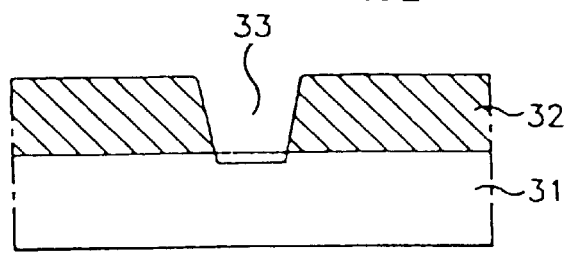
Figure 3C:
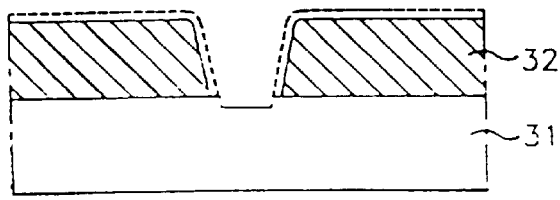
Figure 3D:
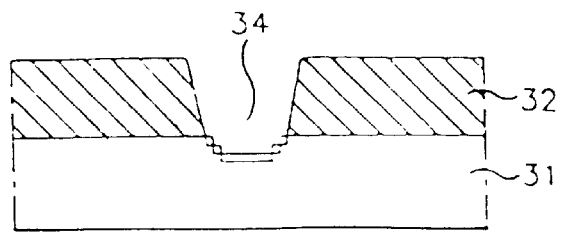
Figure 4A:
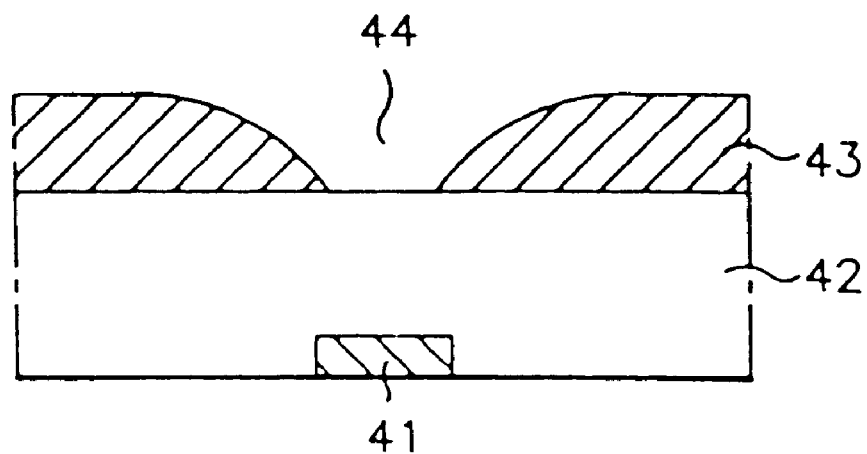
FIGS. 4(a)–4(b) are sectional views showing successive steps in a conventional process for etching a contact.
Figure 4B:
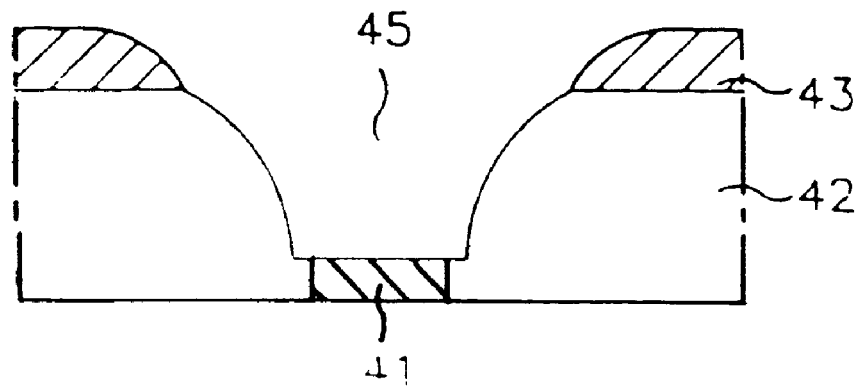
Figure 5A:
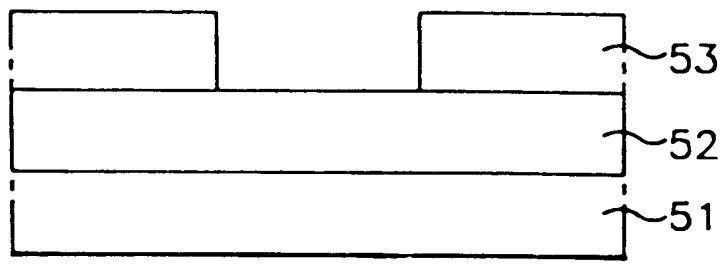
FIGS. 5(a)–5(c) are sectional views showing successive steps for etching a sloped contact in accordance with one embodiment of this invention.
Figure 5B:
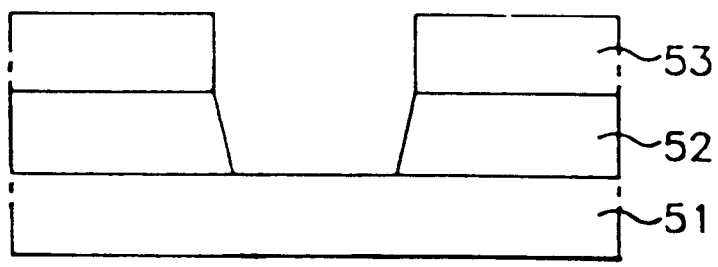
Figure 5C:
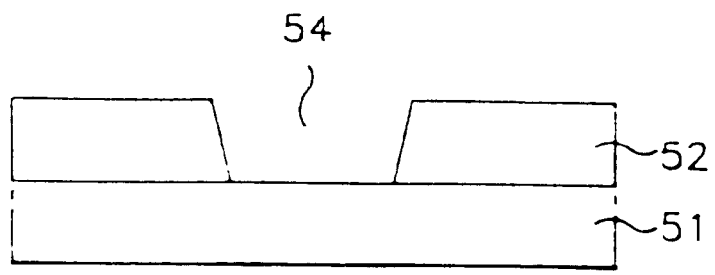

FIGS. 5(a)–5(c) show processes for etching a sloped contact in accordance with one embodiment of this invention.

First, as shown in FIG. 5(a), an insulation layer 52, preferably an oxide film is formed on a substrate 51. A photoresist film 53 is coated onto insulation layer 52 and then patterned with an opening corresponding to where a contact hole is to be formed. Accordingly, the insulation layer 52 is exposed through this opening.

A contact hole 54 having a predetermined slope can be formed, as shown in FIG. 5(b), by etching the insulation layer 52, while the photoresist pattern 53 serves as a mask. The photoresist pattern 53 is then removed as shown in FIG. 5(c).

The contact hole 54 having a predetermined slope can be formed by etching the insulation layer 52 with a single etching process with a controlled flow rate into the etching chamber (not shown) of Ar gas under gas chemistry of $CHF_3/CF_4/Ar$. The balance gas is preferably an inert gas. Herein, $CHF_3$ is a polymer formation gas and Ar is a balance gas.

As for the polymer forming gas, gases, such as $CHF_3$, $C_2F_6$, $CF_3$, $C_3F_8$, and $C_4F_8$ are used, and as for the balance gas, inert gases, such as Ar, He, Xe are used. Also, $N_2$ is used.

In one embodiment of this invention, the forming of a contact hole of 0.4 µm size, the aspect ratio being 3 and the thickness being 1.2 µm, with a slope at an angle of 85° and a micro loading below 10%, is carried out in a MERIE (Magnetic Enhanced Reactive Ion Etching) etcher and a RIE etcher.

If the etching process based on $CHF_3/O_2$ gas chemistry is used, a three step etching process having first and second etching steps and a step for removing a polymer between the first and the second etching steps must be carried out under $CHF_3/O_2$ gas chemistry. However, it is impossible to obtain a slope of 85° and a loading below 10%.

On the other hand, in the etching process based on $CHF_3/CF_4/Ar$ gas chemistry according to the present invention, these criteria can be met. In particular, by controlling a flow rate of a balance gas of Ar with a predetermined ratio of $CHF_3/CF_4$, it is possible to obtain a slope at 85° and a loading below 10%.

In case the etcher is a MERIE etcher a flow of the carrier gas is in a range of 0–200 SCCM (Standard Cubic Centimeter Per Minute) and a ratio of the polymer formation gas to total flow of gas in a range of 20–80% is used.

On the other hand, in case the etcher is a narrow gap etcher such as a RIE etcher or a plasma type etcher the flow of a balance gas is in a range of 100–400 SCCM and a ratio of the polymer formation gas to total flow of gas in a range of 20–80% is used.

Figure 6A:
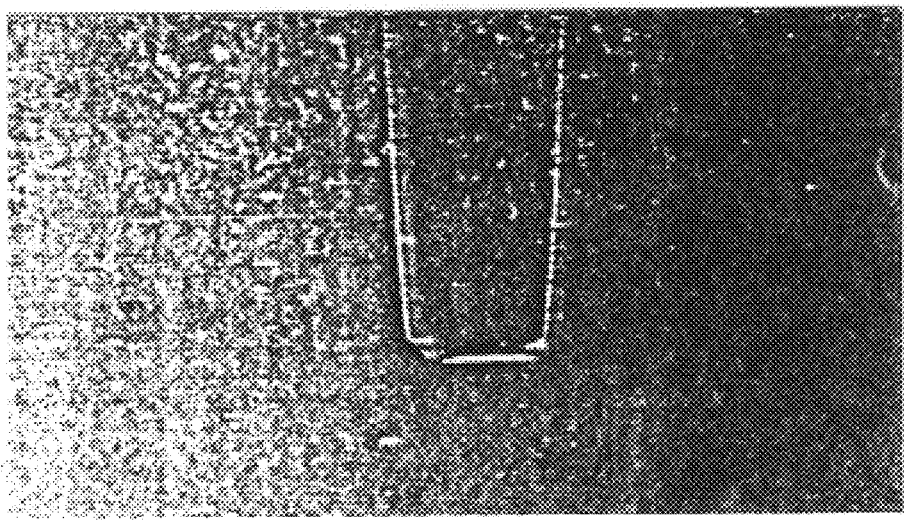
FIGS. 6(a) and 6(b) show a comparison of profiles of contact holes depending on difference of the Ar flow rate when the sloped contact etching in accordance with this invention is carried out with a MERIE etcher.
Figure 6B:
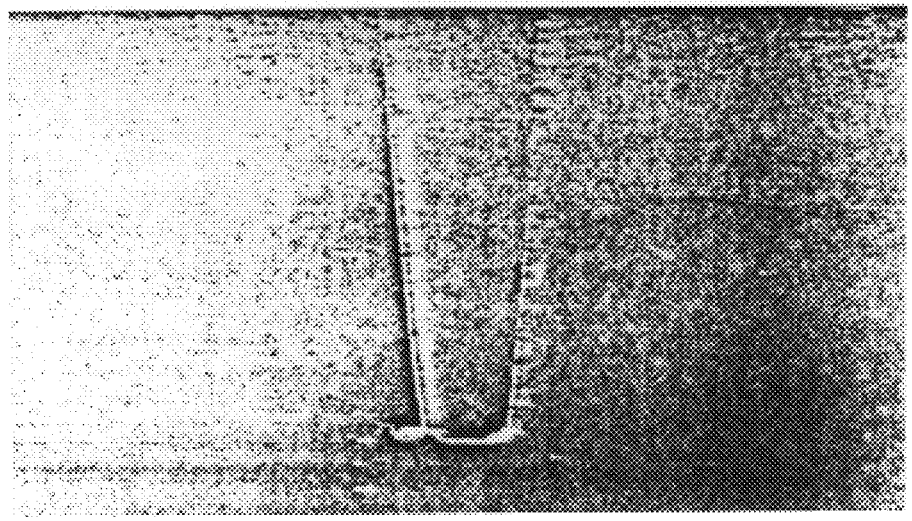

FIGS. 6(a) and 6(b) are photographs of contact holes taken when the foregoing etching processes have been carried out with a MERIE etcher. FIG. 6(a) is the case when the flow rate of Ar is 50 SCCM, and FIG. 6(b) is the case when the flow rate of Ar is 0 SCCM.

Figure 7A:
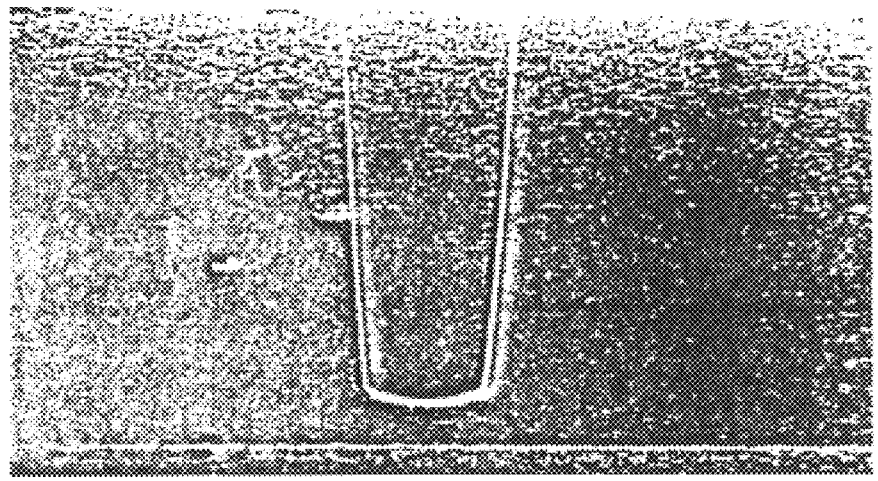
FIG. 7(a) and 7(b) show a comparison of profiles of contact holes depending on the difference of the Ar flow rate when the sloped contact etching in accordance with this invention is carried out with a RIE etcher.
Figure 7B:
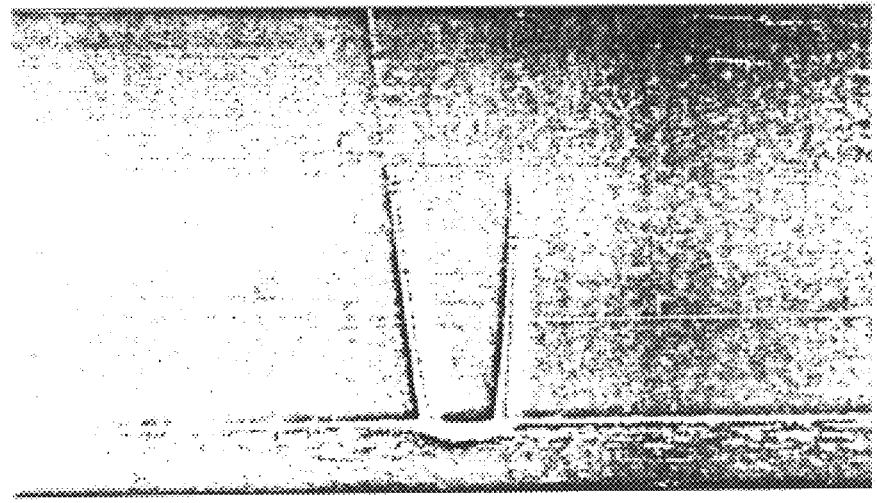

FIGS. 7(a) and 7(b) are photographs of contact holes taken when the foregoing etching processes have been carried out with a RIE etcher. FIG. 7(a) is the case when the flow rate of Ar is 400 SCCM, and FIG. 7(b) is the case when the flow rate of Ar is 200 SCCM.

Referring to FIGS. 6(a)–6(b) and 7(a)–7(b), it can be seen that the best results can be obtained when the flow rate of Ar is 0 SCCM in the case of a MERIE, and 200 SCCM in the case of a RIE.

Reviewing the optimum condition of each etcher, the optimum condition in case of a MERIE etcher is $30CHF_3/20CF_4/0Ar/30mT/650W/70G$, and the optimum condition in case of a RIE etcher is $35CHF_3/25CF_4/200Ar/250mT/800W$.

In the foregoing, the flow of Ar to obtain the optimum result may be varied depending on the kind of etching.

In the process for etching a sloped contact shown in FIGS. 5(a)–5(c), a contact having a predetermined slope can be formed with a single step by controlling the flow rate of Ar.

If the flow rate of Ar is increased, the resulting slope is decreased, conversely if the flow rate of Ar is decreased, the resulting slope is increased.

In this invention, a desired slope can be obtained by controlling the flow rate of Ar. First, a large slope is formed making the Ar flow rate less in the first step, and then in a second step using a greater Ar flow rate to form a slope smaller than the slope formed in the first step. The entire contact profile can be obtained with a two step process.

As has been explained, since the slope can be controlled by a single step with a controlled flow rate of Ar in accordance with this invention, rather than by multiple steps as in the conventional process, the process is simplified and the reproducibility can be improved.

Further, since a desired size of a slope can be obtained by controlling the flow rate of Ar, it is favorable for securing an overlay margin during a photolithography step, and can improve the step coverage of a deposited film.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for forming a semiconductor device comprising the steps of:

provinding an insulation layer on a substrate;

exposing a portion of said insulation layer by providing a photoresist pattern on said insulation layer;

performing a first etching step of said insulation layer, said first etching step including the steps of:

introducing into an etching chamber a first gas including $CF_4$, a second gas including a polymer forming gas, other than $CF_4$, and a third gas including an inert gas; and controlling a first flow rate of said inert gas to have a first flow rate value; and performing a second etching step of said insulation layer, said second etching step ;including the step of controlling a second flow rate of said inert gas to have a second flow rate value, said second flow rate value being greater than said first flow rate value, wherein said second etching step yields a contact hole in said insulation layer having sloped sidewalls.

2. The method of claim 1, said introducing a plurality of gases into an etching chamber includes:

introducing said third gas, including an inert gas which is one of Ar, He, Xe, and $N_2$.

* * * * *

UNITED STATES PATENT AND TRADEMARK OFFICE
CERTIFICATE OF CORRECTION

PATENT NO.: 6,040,247
DATED: March 21, 2000
INVENTORS: Seong Woo CHUNG

It is certified that an error appears in the above-identified patent and that said Letters Patent is hereby corrected as shown below:

Claim 1, Column 6, line 40, ";including " should read --including--.

Signed and Sealed this

Twenty-fourth Day of April, 2001

Attest:

NICHOLAS P. GODICI

Attesting Officer

Acting Director of the United States Patent and Trademark Office